United States Patent Office 3,017,332

Patented Jan. 16, 1962

3,017,332

METHOD OF JET PLATING INDIUM-LEAD ALLOY ELECTRODES ON GERMANIUM

George L. Schnable and John G. Javes, Lansdale, Pa., assignors to Philco Corporation, Philadelphia, Pa., a corporation of Pennsylvania No Drawing. Filed Jan. 16, 1959, Ser. No. 787,128
6 Claims. (Cl. 204—15)

This invention relates to the manufacture of semiconductor devices such as transistors, and more particularly to the jet plating of indium electrodes onto germanium blanks in the course of manufacture of such devices.

Jet plating of electrodes in the manufacture of semiconductor devices such as transistors is now a well known procedure. For the present purpose it suffices to note that in the jet plating of an electrode onto a semiconductor body, an electrolyte containing a salt of the metal to be deposited is directed in a stream from a jet device against the surface onto which the metal is to be applied, and current is passed through the stream in the direction from the jet device to said surface to ffect the electroplating action. A detailed description of the manufacture of semiconductor devices employing jet plating of electrodes is set forth in a copending application of J. W. Tiley and R. A. Williams, Serial No. 472,824, filed December 3, 1954.

In the manufacture of semiconductor devices such as transistors it is highly important to be able to provide readily and consistently exact configurations and locations of the electrodes, and the jet plating procedure is well suited for the purpose. However, from a cost standpoint the time required for the jet plating of an electrode onto the semiconductor body is also very important. In the past, efforts have been made to reduce the jet plating time, and as a result of such efforts the time has been reduced to about 15 seconds.

In the manufacture of transistors such as the micro-alloy diffused-base transistor, indium electrodes are plated onto germanium wafers. A detailed description of the manufacture of such transistors is set forth in a copending application of R. A. Williams, Serial No. 669,852, filed July 3, 1957, and now abandoned. By way of example, the electrolytic plating solution employed in the plating of indium electrodes onto germanium may comprise indium trichloride ($InCl_3$) and a small amount of an additive such as Sorbit AC, a 65% sodium butyl naphthalene sulfonate, or a 15% aqueous solution of decyl benzene sodium sulfonate.

In the preferred method and construction of such a transistor small dots of indium are jet plated onto opposite sides of a thin portion of the germanium wafer, and at least one of these electrodes is micro-alloyed with the germanium, e.g. during the soldering of the connecting lead to the electrode.

In the development of a low cost micro-alloy diffused-base transistor, it was determined that if the plating time could be reduced to a very short time interval, e.g. 5 seconds or less, this would be highly effective in reducing the unit cost. However, when efforts were directed toward such drastic reduction of the plating time, a serious problem was encountered. It was found that with such rapid plating of the indium electrodes, during the subsequent micro-alloying operation at least one of the electrodes tended to contract into a ball, which deformation has been aptly termed "ball-up" of the electrode.

By way of example, in one method of making such transistors, the emitter and the collector are jet plated onto opposite sides of the germanium wafer, then a connecting lead in the form of a whisker is soldered to the emitter and at the same time the emitter is micro-alloyed with the germanium, and finally a connecting lead also in the form of a whisker is soldered to the collector. In this method it was found that with rapid plating of the electrodes in a short time interval of the order of 5 seconds or less, during micro-alloying of the emitter heat applied for the micro-alloying was conducted through the germanium blank to the collector and caused the latter to deform. In practice of this particular method the emitter did not deform, apparently due to the relatively large quantity of solder present during the one-step process of lead attachment and micro-alloying.

Broadly stated, the problem is that where the electrodes are so rapidly plated onto the germanium and at least one of the electrodes is micro-alloyed with the germanium, the heat required for the micro-alloying operation tends to cause deformation of at least one of the electrodes.

The principal object of the present invention is to provide a satisfactory solution of this problem and to achieve satisfactory plating of the indium electrodes within a very short time interval.

We have discovered that if a small amount of a soluble lead salt, such as lead dichloride ($PbCl_2$), is added to the indium salt plating solution for the electrode or electrodes that tends to deform, the desired rapid plating of the indium electrodes onto the germanium base can be achieved without subsequent electrode distortion or deformation during the micro-alloying operation. The added lead salt causes the plated electrode to contain lead as a minor alloy constituent but its characteristics are still those of indium. A spectrographic analysis has shown that metal plated with a solution containing 0.1 gram of lead dichloride per liter will contain greater than 1% lead. Melting point tests of the plated metal have shown tha its melting point is not appreciably different from that of pure indium metal. Therefore, since the amount of lead salt added by this invention is considerably less than 0.1 gram per liter, the effectiveness of the lead in preventing undesired electrode distortion during the micro-alloying operation cannot be attributed to any change in the melting point of the electro-plated metal. While we do not definitely know the reason why the added lead is effective for this purpose, we believe it may be due to modification of the surface tension of the plated metal and/or the adhesion thereof to the germanium. Apparently in the absence of the lead with rapid plating of the metal its surface tension and/or its adhesion to the germanium are such as to render it susceptible to distortion during the micro-alloying operation; and apparently the added lead effectively changes the surface tension and/or adhesion of the plated metal so as to decrease or eliminate its susceptibility to such distortion. Whatever the reason, experiments have definitely shown that a small amount of soluble lead salt additive is effective to prevent the aforementioned electrode deformation and enables satisfactory plating of the electrodes onto the germanium within a very short time interval, e.g. 5 seconds or less.

Thus in the manufacture of semiconductor devices involving rapid jet plating of indium electrodes onto germanium wafers or blanks by directing a stream of electrolyte containing an indium salt against the germanium surface onto which the indium is to be applied and passing current through the electrolyte stream to said surface, and also involving subsequent micro-alloying of at least one of the electrodes with the germanium which tends to cause deformation of at least one of the electrodes, the present invention provides the improvement which comprises conducting the jet plating of each electrode that tends to be deformed with a small amount of a soluble lead salt added to the electrolyte sufficient substantially to preclude intolerable electrode deformation during the micro-alloying operation.

In the particular method hereinbefore mentioned wherein only the collector tended to deform, only the plating solution for the collector need contain the added lead salt. But it will be understood that in any instance the invention contemplates use of the added lead salt in the plating solution for each electrode that tends to deform.

Experimentation has shown that for given conditions there is an optimum amount of lead salt that will serve the purpose of the present invention. While the preferred amount given in the following example is 0.015 gram per liter of the solution, the optimum amount depends upon the conditions in any instance. Decreasing the amount of lead salt from the optimum amount tends to make it less effective to prevent the undesired electrode distortion during the micro-alloying operation. Increasing the amount of lead salt substantially from the optimum amount serves no useful purpose and may adversely affect the plating. In any case, under given conditions the optimum amount can be determined by trial.

Experiments have indicated that under the conditions hereinafter set forth, with 0.010 gram of lead dichloride per liter of the plating solution, the ball-up of the plated electrode during the micro-alloying operation is reduced to about 50%; that with 0.012 gram of lead dichloride per liter of the plating solution, the ball-up of the plated electrode is reduced to about 10%; and that with 0.014 gram or more of lead dichloride per liter of the plating solution, the ball-up of the plated electrode is completely eliminated.

By way of example, a plating solution in accordance with this invention may be prepared as follows.

A lead chloride solution is prepared by dissolving four grams of lead chloride in distilled water and diluting to 800 ml. mixing the solution thoroughly.

A Sorbit AC solution is prepared by dissolving forty grams of Sorbit AC in distilled water and diluting to 100 ml., mixing the solution thoroughly.

The plating solution may then be prepared in the following manner. Add 658 ml. of indium trichloride concentrate (1.05 grams $InCl_3$ per ml.) solution and 16 ml. of concentrated hydrochloric acid to an 18 liter carboy. Add about 10 liters of distilled water. Then add 54 ml. of the previously prepared lead chloride solution. Then dilute the solution to 18 liters with distilled water and mix it thoroughly. Then measure the pH of the solution to determine whether it is within the range 2.2 to 2.5 which is the accpted range. If the pH is too high, additional hydrochloric acid should be added. If it is too low, it can be raised by adding ammonium hydroxide.

Just before the solution is to be used for jet plating, 1.8 ml. of the previously prepared Sorbit AC solution should be added to each 18 liter batch of plating solution, and the solution should be thoroughly mixed.

The plating solution then contains 38.4 grams of $InCl_3$ per liter, 0.015 gram of $PbCl_2$ per liter, and 0.040 gram of Sorbit AC per liter.

With such a solution, satisfactory plating of an indium electrode onto germanium can be achieved in four seconds, using a jet size of 6.9 mils, a plating current of 1 milliampere, and a flow rate of 24 ml. per second, and the added lead salt prevents deformation of the electrode during the micro-alloying operation.

It will be understood, of course that the above-described example is not intended to limit the invention which contemplates in any case the addition of a small amount of a lead salt to the indium plating solution sufficient substantially to preclude intolerable deformation of the plated electrode during the subsequent micro-alloying operation.

We claim:

1. In the manufacture of semiconductor devices involving rapid jet plating of indium electrodes onto germanium blanks by directing a stream of electrolyte containing an indium salt against the germanium surface onto which the indium is to be applied and passing electric current through the electrolyte stream to said surface, and also involving subsequent application of heat to effect micro-alloying of at least one of the electrodes with the germanium which tends to cause deformation of at least one of the electrodes, the improvement which comprises conducting the jet plating of each electrode that tends to be deformed with a small amount of a soluble lead salt added to the electrolyte sufficient substantially to preclude intolerable deformation of the plated electrode during the subsequent micro-alloying operation, at least some of the lead plating out and becoming a minor alloy constituent of the plated electrode.

2. The method of claim 1 wherein the plating time is about 5 seconds.

3. The method of claim 1 wherein the indium salt contained in the electrolyte is indium trichloride.

4. The method of claim 1 wherein the lead salt is lead dichloride.

5. The method of claim 1 wherein the amount of added lead salt is at least 0.014 gram per liter of the electrolytic plating solution.

6. The method of claim 1 wherein the lead-containing plating solution contains 38.4 grams of indium trichloride, 0.015 gram of lead dichloride, and 0.040 gram of a surface-active agent.

References Cited in the file of this patent

UNITED STATES PATENTS

| | | |
|---|---|---|
| 2,567,934 | Green et al. | Sept. 18, 1951 |
| 2,814,589 | Waltz | Nov. 26, 1957 |
| 2,873,232 | Zimmerman | Feb. 16, 1959 |
| 2,914,445 | Mayer | Nov. 24, 1959 |